United States Patent [19]

Cheng

[11] Patent Number: 5,937,878
[45] Date of Patent: Aug. 17, 1999

[54] APPARATUS FOR REMOVING PARTICLES FROM A WAFER AND FOR CLEANING THE WAFER

[75] Inventor: Wan-Li Cheng, Hsinchu, Taiwan

[73] Assignee: Vanguard International Semiconductor Corporation, Hsinchu, Taiwan

[21] Appl. No.: 08/993,728

[22] Filed: Dec. 18, 1997

[51] Int. Cl.⁶ .................................................. B08B 3/12
[52] U.S. Cl. ........................ 134/111; 134/186; 134/184; 134/902
[58] Field of Search .................................. 134/186, 184, 134/902, 111

[56] References Cited

U.S. PATENT DOCUMENTS

| | | | |
|---|---|---|---|
| 5,186,192 | 2/1993 | Netsu | 134/68 |
| 5,339,842 | 8/1994 | Bok | 134/1 |
| 5,383,483 | 1/1995 | Shibano | 134/111 |

*Primary Examiner*—Frankie L. Stinson
*Assistant Examiner*—Miakeka C. Williams-Bibbs
*Attorney, Agent, or Firm*—Christensen O'Connor Johnson & Kindness PLLC

[57] ABSTRACT

The present invention includes an apparatus having a container (30) for storing liquid and holding a semiconductor wafer (32). The apparatus also includes a transducer (36) and a sonic generator (34). The transducer is attached to the container to transfer megasonic waves generated by the sonic generator into the container. A drain (38) releases the liquid from the container. At least one outlet opening (40) is set at the bottom of the container. Liquid inlets (42) provide the liquid to the container. Nozzles (44), connected to the liquid inlets, spray the liquid on the surface of the wafer. A liquid supply element (46) provides liquid to the container. Drive means (54), connected to the outlet opening of the container, circulates the liquid. A filter (56) is connected between the drive means and the liquid supply element to filter out residue in the liquid.

12 Claims, 2 Drawing Sheets

APPARATUS FOR REMOVING PARTICLES FROM A WAFER AND FOR CLEANING THE WAFER

TECHNICAL FIELD OF THE INVENTION

The present invention relates to an apparatus for removing particles and, more particularly, to an apparatus for removing unwanted particles on semiconductor wafers.

BACKGROUND OF THE INVENTION

As device density in semiconductor ICs increases, control over semiconductor process conditions is increasingly crucial. In VLSI fabrication, the accurate control of layer thickness, reaction temperature, and pressure is more important than ever for reducing defects in semiconductor ICs. Many materials that are used in semiconductor processes undergo, for example, etching, patterning, and planarization processes after the materials are formed on the semiconductor wafer. Before processes are carried out in a reaction chamber, the wafer will be send to chemical stages for cleaning the wafer. The unwanted particles will typically be removed from the wafer during the stages.

FIG. 1 shows in schematic form a conventional apparatus 1 for removing unwanted particles formed on a semiconductor wafer and cleaning the wafer 11. The apparatus 1 is used during a cleaning step. The apparatus 1 includes a container 3 for containing liquid, such as deionized (DI) water. The container 3 is typically made of quartz. A valve 5 is located at the bottom of the container 3 for draining the liquid out of the container 3. The container 3 includes liquid inlets 3a. The liquid inlets 3a are defined by container walls. The liquid inlets 3a direct liquid into the container 3. Nozzles 9 are connected to the liquid inlets 3a. Another nozzles 2 are set at top of the container 3 for sparying liquid into the container 3.

During the cleaning step, the nozzles 9 spray liquid on the surface of the wafer 11 in the container 3. The wafer 11 is first suitably positioned in the container 3. The liquid inlets 7 and the nozzles 9 supply the liquid into the container 3. After the cleaning step, the liquid is drained by opening the valve 5. The cleaning step is intended to remove some of the unwanted particles generated on the wafer 11 during the semiconductor processes described above. However, the apparatus 1 fails to remove a significant amount of the particles. The failure stems from the relatively secure attachment of the particles on the wafer 11.

Conventional techniques employing sonic generators have been proposed and implemented as attempts to more successfully remove particles from semiconductor wafers. Turning to FIG. 2, one such conventional technique includes an apparatus 20 having a container 21 for storing water. A transducer 23 is located at the bottom of the container 21. A sonic generator 25 is connected to the transducer 23 for generating megasonic waves. As is well known by those skilled in this art and others, such waves generated by the sonic generator 25 can remove some particles stuck on the surface of a semiconductor wafer.

The transducer 23 transfers the megasonic waves generated by the sonic generator 25 to the container 21. The container 21 also includes at least one liquid inlet 27 for supplying liquid, e.g., deionized water, to the container 21. Nozzles 29 are connected to the liquid inlets 27. The nozzles 29 spray the liquid at the wafer 31. A drain 33, located at the bottom of the container 21 adjacent to the transducer 23, drains the liquid from the container 21.

Although the apparatus 20 arguably solves some of the drawbacks associated with other prior art designs, the apparatus 20 also poses some of its own significant problems. One primary problem involves the drain rate of the liquid in the container 21. The drain rate of the drain 33 is unduly slow, causing associated drawbacks in efficiency and economy. Further, the result after cleaning the wafer is poor. Accordingly, a new, improved apparatus for removing unwanted particles on semiconductor wafers is needed.

SUMMARY OF THE INVENTION

The present invention includes an apparatus having a container for storing liquid and holding a wafer. The apparatus also includes a sonic generator, for generating megasonic waves, and a transducer. The megasonic waves remove unwanted particles attached to the wafer. The transducer is set at the top of the container to transfer the waves generated by the sonic generator into the container. A drain is set at the bottom of the container to release the liquid from the container. Outlet openings are set at the bottom of the container. The container further includes liquid inlets to provide the liquid to the container. The liquid inlets are defined by the container wall. Nozzles are connected to the liquid inlets for spraying liquid on the surface of the wafer.

A liquid supply element is used to provide the liquid to the transducer and the container. A first valve is set between the liquid supply element and the transducer to control the flow of the liquid into the transducer. A plurality of second valves are set between the liquid inlets and the liquid supply element. Drive means, connected to the outlet opening of the container, circulates the liquid. One end of a filter is connected to the drive means to filter out residue in the liquid. The other end of the filter is connected to the liquid supply element.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
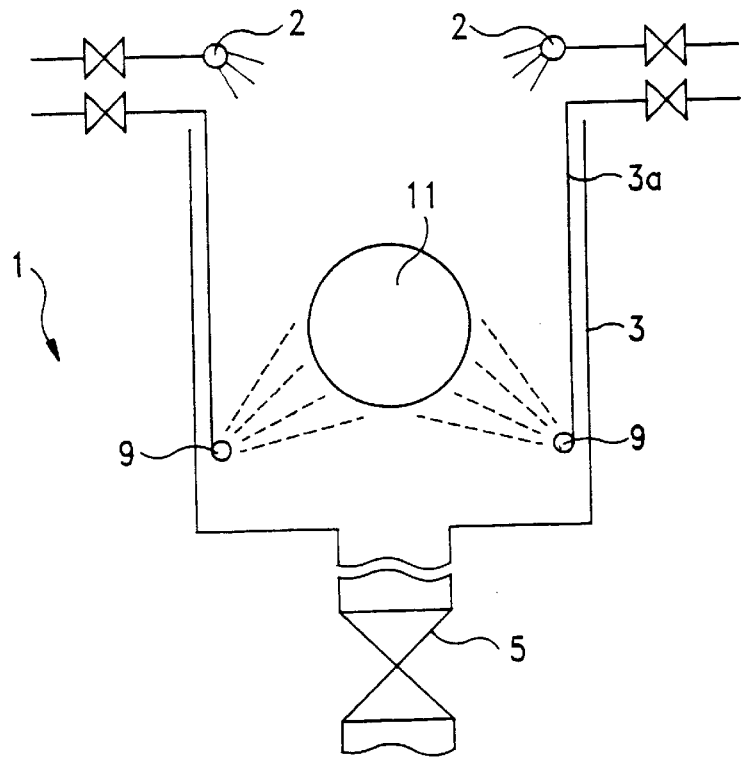
FIG. 1 is a schematic diagram of a first prior art apparatus for cleaning a semiconductor wafer.
Figure 2:
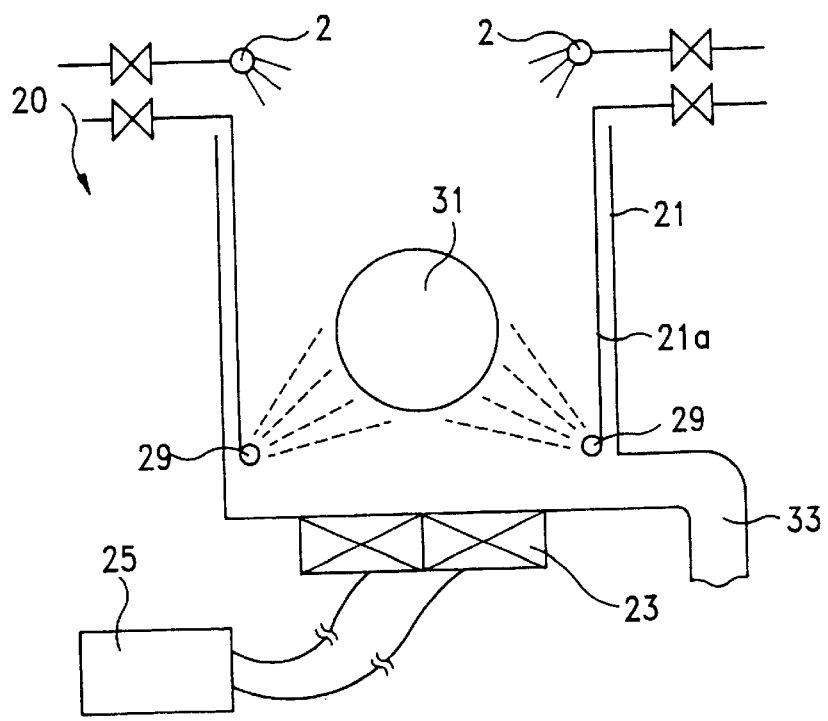
FIG. 2 is a schematic diagram of a second prior art apparatus for cleaning a semiconductor wafer.
Figure 3:
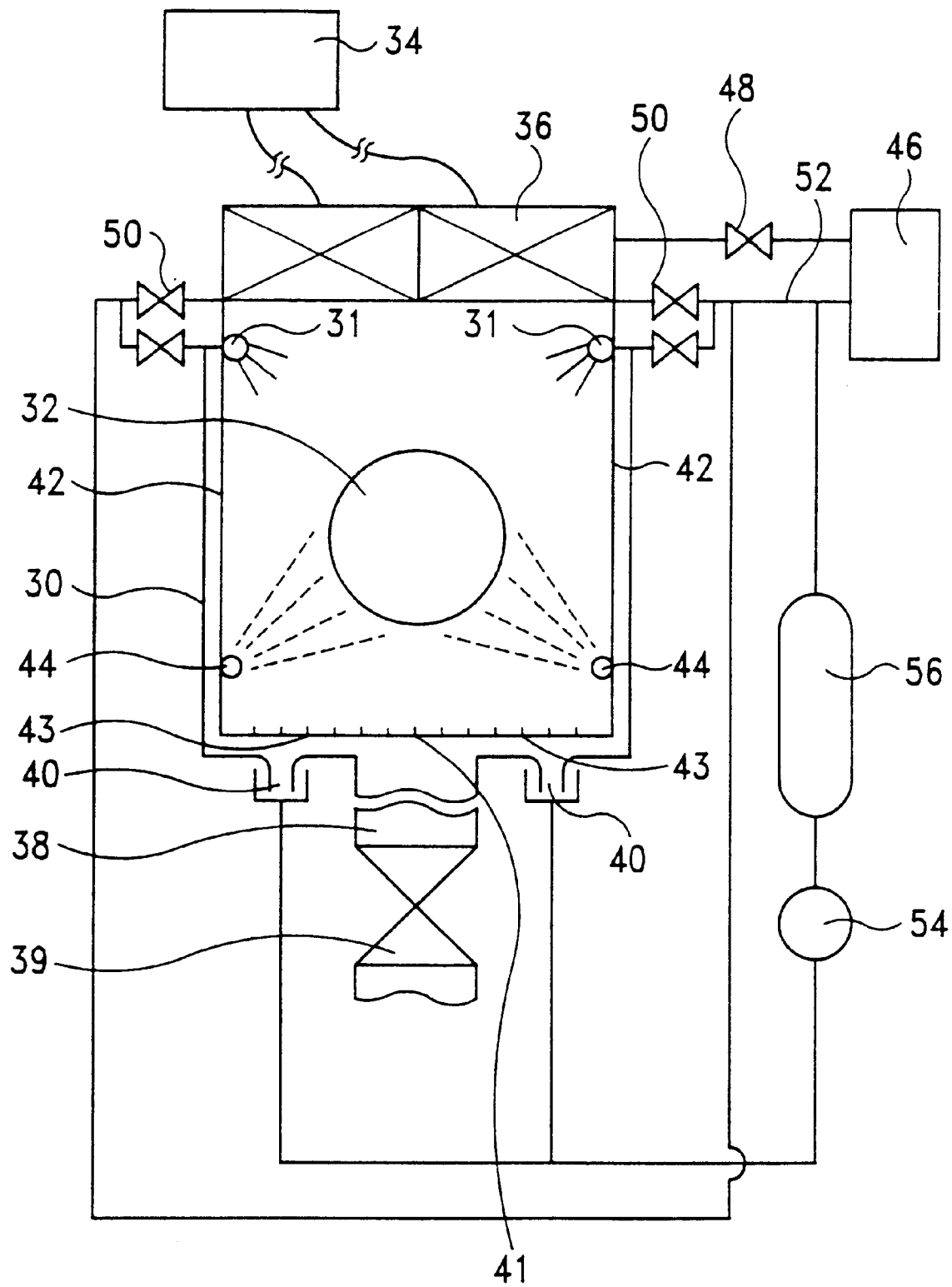
FIG. 3 is a schematic diagram of an apparatus for cleaning a semiconductor wafer in accordance with the present invention.

FIG. 3 illustrates an apparatus for cleaning a semiconductor wafer in accordance with the present invention. The apparatus can be divided into two major portions. The first portion generates megasonic waves for removing unwanted particles on the semiconductor wafer. A second portion is a circulation system for controlling the flow of liquid used to speed up the rate of cleaning the semiconductor wafer. As described in more detail below, the portions can be used simultaneously or individually, as appropriate.

The first portion of the system in accordance with the present invention includes a container 30 for storing liquid and holding at least one semiconductor wafer 32. The container 30 is preferably made of quartz. The system further includes a sonic generator 34 connected to a transducer 36. The sonic generator 34 generates megasonic waves for removing particles stuck on, or otherwise securely attached to, the wafer 32 during semiconductor processes. The transducer 36 is positioned at the top of the container 30 to transfer the megasonic waves generated by the sonic generator 34 to the container 30.

A drain 38 is located at the bottom of the container 30 to drain the liquid out of the container 30. Preferably, a drain valve 39 controls the flow of the drain 38. The drain valve 39, as well as other valves described below, each can be set to an on and an off position. Initially, the drain valve 39 is set to the off position to close the drain 38. In the present invention, at least one outlet openings 40 are located at the bottom of the container 30.

The container 30 further includes liquid inlets 42 to provide liquid to the container 30. Nozzles 44, connected to the liquid inlets 42, spray liquid, e.g., deionized (DI) water, on the surface of the wafer 32 in the container 30. The liquid is injected into the container 30 through the liquid inlets 42 and the nozzles 44. Further, nozzles 31 are set at the top of the container 30 to perform the same function of the nozzles 44.

The liquid inlets 42 can optionally include a plurality of pipes 41 situated along the bottom surface of the container 30. The pipes 41 have a plurality of openings 43 for spraying liquid into the container 30. Alternatively, a plurality of pipes can be used to replace the liquid inlets 42. The pipes can be defined along the inner side wall of the container 30.

The second portion of the apparatus in accordance with the present invention includes a liquid supply element 46 used to ultimately provide the liquid to the container 30. The liquid supply element 46 provides the liquid to the transducer 36. A first valve 48 is located between the liquid supply element 46 and the transducer 36 to control the amount of the liquid flow. The first valve 48 allows the liquid to flow to the transducer 36 for generating megasonic wave liquid when the first valve 48 is set to the on position.

The liquid in the liquid supply element 46 is also fed into the container 30 via the liquid inlets 42 and the nozzles 44. A plurality of second valves 50, controlling the amount of flow of liquid through the liquid inlets 42, are located between the liquid inlets 42 and the liquid supply element 46. The second valves 50 allow the liquid to flow when they are set to the on position.

The liquid supply element 46, the container 30, and the liquid inlets 42 form a flow circulation path. The liquid supply element 46 is connected to the liquid inlet 42 by a pipe 52. Drive means 54, such as a pump, is connected to the outlet openings 40 of the container 30 using the pipe 52. Preferably, one end of a filter 56 is connected to the pump 54 to filter out residue from the liquid. A second end of the filter 56 is connected to the liquid inlet 42.

An operational sequence of the system of the present invention will now be described. The wafer 32 is appropriately placed at a predetermined position in the container 30. The first and the second valves 48, 50 are set to the on position, providing liquid to the transducer 36 and the liquid inlets 42. Further, the drain valve 39 for controlling the drain 38 is set to the off position. The liquid is injected into the container 30 to a desired level through the liquid inlets 42, the nozzles 44, the nozzles 31 and the openings 43 if present.

At the same time, the sonic generator 34 is turned on to generate megasonic waves. The pump 54 is also turned on. The pump 54 drives the liquid to circulate in the system. The solenoid valve 39 is turned on and the liquid is quickly drained out of the container 30 by the drain 38. The aforementioned steps can be repeated to remove unwanted particles on the wafer 32. The first and second portions of the system can be implemented either individually or concurrently to remove the unwanted particles.

The system of the present invention provides many significant advantages over the prior art. For example, the system allows the liquid to quickly drain out of the container 30. As another example, the unwanted particles firmly attached to the wafer 32 can be removed by megasonic waves.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. An apparatus for removing particles on a wafer and for cleaning said wafer, said apparatus comprising:

a container for holding said wafer and for storing liquid, said container having at least one liquid inlet, at least one outlet opening, and a drain, said at least one outlet opening formed at a bottom of said container, said drain set at said bottom of said container for draining said liquid;

a transducer set at a top of said container;

a sonic generator, connected to said transducer, for generating sonic waves to remove said particles, said transducer used to transfer said sonic waves to said container;

a liquid supply element, connected to said transducer and said at least one liquid inlet, for supplying said liquid to said container;

means, connected to said at least one outlet opening, for driving and circulating said liquid;

a filter, connected to said means for driving and circulating, for filtering out residue in said liquid;

a first valve, connected between said liquid supply element and said transducer, said first valve allowing said liquid to flow when set to an on position; and a second valve, connected between said liquid supply element and said at least one liquid inlet, said second valve allowing said liquid to flow when set to an on position.

2. The apparatus of claim 1 wherein said at least one liquid inlet is defined by a wall of said container, said liquid being injected into said container through said at least one liquid inlet.

3. The apparatus of claim 1 further comprising a nozzle connected to said at least one liquid inlet for spraying said liquid on a surface of said wafer.

4. The apparatus of claim 3 wherein said at least one liquid inlet is defined by a wall of said container, said liquid being injected into said container through said at least one liquid inlet and said nozzle.

5. The apparatus of claim 1 wherein said at least one liquid inlet includes a plurality of pipes set along said bottom of said container, said plurality of pipes having a plurality of openings for spraying said liquid into said container.

6. The apparatus of claim 1 wherein said liquid is deionized water.

7. The apparatus of claim 1 wherein said container is made of quartz.

8. The apparatus of claim 1 wherein said sonic waves have a frequency of approximately 900 to 1100 kHz.

9. An apparatus for removing particles on a wafer, said apparatus comprising:

a container for holding said wafer and containing liquid, the container having at least one liquid inlet and at least one outlet opening formed at a bottom of said container, said liquid being fed into said container through said at least one liquid inlet;

a nozzle connected to said at least one liquid inlet for spraying said liquid on a surface of said wafer;

a drain set at said bottom of said container for draining said liquid;

a transducer set at a top of said container;

a sonic generator, connected to said transducer, for generating sonic waves to remove said particles, said transducer used to transfer said sonic waves to said container;

a liquid supply element, connected to said transducer and said at least one liquid inlet, for supplying liquid to said container;

means, connected to said at least one outlet opening, for driving and circulating said liquid;

a filter, connected to said means for driving and circulating, for filtering out residue in said liquid;

a first valve located between said liquid supply element and said transducer, said first valve allowing said liquid to flow when set to an on position; and a second valve located between said liquid supply element said at least one liquid inlet, said second valve allowing said liquid to flow when set to an on position.

10. An apparatus for removing particles on a wafer, said apparatus comprising:

a container for holding said wafer and for storing liquid, said container having at least one liquid inlet, at least one outlet opening, and a drain, said at least one outlet opening formed at a bottom of said container, said drain set at said bottom of said container for draining said liquid;

a transducer set at a top of said container;

a sonic generator, connected to said transducer, for generating sonic waves to remove said particles, said transducer used to transfer said sonic waves to said container;

a liquid supply element, connected to said transducer and said at least one liquid inlet, for supplying said liquid to said container;

means, connected to said at least one outlet opening, for driving and circulating said liquid; and a filter, connected to said means for driving and circulating, for filtering out residue in said liquid.

11. The apparatus of claim 10 further comprising a valve, connected between said liquid supply element and said transducer, said valve allowing said liquid to flow when set to an on position.

12. The apparatus of claim 10 further comprising a valve, connected between said liquid supply element and said at least one liquid inlet, said valve allowing said liquid to flow when set to an on position.

* * * * *